United States Patent [19]

Manning

[11] Patent Number: 5,286,663
[45] Date of Patent: Feb. 15, 1994

[54] METHODS FOR PRODUCING THIN FILM TRANSISTOR HAVING A DIODE SHUNT

[75] Inventor: Monte Manning, Boise, Id.

[73] Assignee: Micron Technology, Inc., Boise, Id.

[21] Appl. No.: 828,001

[22] Filed: Jan. 29, 1992

[51] Int. Cl.$^5$ .......................................... H01L 21/265
[52] U.S. Cl. ......................................... 437/41; 437/46; 437/191; 437/192; 437/200; 437/956; 257/350
[58] Field of Search ................. 437/192, 956, 904, 46, 437/52, 200, 41, 191; 257/903, 904, 250; 431/191

[56] References Cited

U.S. PATENT DOCUMENTS

| | | | |
|---|---|---|---|
| 4,581,623 | 4/1986 | Wang | 437/915 |
| 4,656,731 | 4/1987 | Lam et al. | 437/915 |
| 4,814,841 | 3/1989 | Masuoka et al. | 257/903 |
| 5,157,474 | 10/1992 | Ochii | 257/904 |

OTHER PUBLICATIONS

A. O. Adan, et al., "Leakage Current In Polysilicon MOS Thin-Film Transistors and an Optimum Self-Aligned Structure for High Density SRAMs," (Date Unknown).

M. Ando, et al., "A 0.1 μA Standby Current, Bouncing-Noise-Immune 1 Mb SRAM," IEEE Journ. of Solid State Circuits, pp. 1708–1713, Dec. 1989.

Ikeda et al., "A Polysilicon Transistor Technology For Large Capacity SRAMs," IEDM 1990, pp. 469–472.

H. Chkubo et al., "16 Mbit SRAM Cell Technologies for 2.0V Operation," NEC Corporation, (Date Unknown).

Primary Examiner—Olik Chaudhuri
Assistant Examiner—H. Jey Tsai
Attorney, Agent, or Firm—Wells, St. John, Roberts, Gregory & Matkin

[57] ABSTRACT

Disclosed herein is a method and structure which connects a thin film transistor active region to a semiconductor region of a different conductivity type and which shunts the parasitic diode formed between the two regions. A transistor gate is formed on a semiconductor substrate. A thin film of polysilicon is provided over the transistor gate to form thin film active regions and a thin film channel region. The thin film active regions are doped with an impurity of a first conductivity type. A semiconductor region of a second conductivity type is also formed over the semiconductor substrate, with the thin polysilicon film forming a connecting region which overlies and contacts the semiconductor region. The connecting region is doped to a second conductivity type to create a parasitic diode in the thin polysilicon film rather than between the connecting region and the thin polysilicon film. A silicide shunt is formed between one active region of the thin film transistor and the connecting region of the thin film. The silicide shunt eliminates the voltage drop associated with the parasitic diode and also reduces resistance throughout the active regions.

21 Claims, 4 Drawing Sheets

METHODS FOR PRODUCING THIN FILM TRANSISTOR HAVING A DIODE SHUNT

TECHNICAL FIELD

This invention relates to methods and structures for shunting a parasitic diode formed between a conductively doped thin film transistor active region and a connected semiconductor region of an opposite conductivity type.

BACKGROUND OF THE INVENTION

FIG. 1 shows a prior art thin film transistor 10 comprising a conductive silicon gate 12, a heavily doped p-type (p+) thin film active or source region 14, a p+ thin film active or drain region 16, and a lightly doped n-type (n−) thin film channel region 18. Thin film transistor 10 is formed over a silicon substrate 20 and an oxide isolation layer 22. Gate 12 has a top surface 24 which is covered by oxide layer 22. Isolation oxide layer 22 insulates gate 12 from thin film active regions 14 and 16 and from thin film channel region 18. Isolation oxide layer 22 is typically no more than about 700 Angstroms thick over top surface 24 of gate 12 to allow effective gating of thin film transistor 10 by top surface 24.

It is often desired to connect a conductively doped active region of a thin film transistor to a semiconductor region of a different, opposite conductivity type. The semiconductor region may be an active region of another transistor, a conductive runner in a memory circuit, or another semiconductor region to which the thin film transistor active region must be connected. This is the case in FIG. 1, where thin film transistor p+ drain region 16 is connected to an n+ semiconductor region 28.

This connection forms a parasitic diode at the junction of thin film p+ drain region 16 and n+ semiconductor region 28. The parasitic diode is detrimental to circuit operation even when it is subject only to a forward bias because of the voltage drop it causes. If the parasitic diode is subject to being reverse biased, its presence can be fatal to circuit operation. Yet, such a parasitic diode is characteristic of many circuits utilizing thin film transistors.

BRIEF DESCRIPTION OF THE DRAWINGS

A preferred embodiment of the invention is described below with reference to the following accompanying drawings, in which.

DETAILED DESCRIPTION OF THE PREFERRED EMBODIMENT

This disclosure of the invention is submitted in furtherance of the constitutional purposes of the U.S. Patent Laws "to promote the progress of science and useful arts." U.S. Constitution, Article 1, Section 8.

The invention provides a diode shunt between a conductively doped active region of a thin film transistor and an associated semiconductor region of an opposite conductivity type. The diode shunt eliminates the detrimental effects of the parasitic diode without significantly adding to or interfering with existing CMOS processing steps.

In accordance with the invention, a method of forming a thin film transistor and of connecting a thin film transistor active region of a first conductivity type to a connecting region of a second conductivity type comprises the following steps:

forming a transistor gate on a semiconductor substrate;

providing a thin film of polysilicon over the transistor gate for formation of thin film active regions and a thin film channel region;

providing a mask layer over the thin film of polysilicon;

patterning and etching the mask layer to remove the mask layer over the thin film active regions and to define a channel mask overlying the thin film channel region;

doping the thin film active regions with an impurity of the first conductivity type to provide first conductivity type active regions and to form an exposed parasitic diode junction between one thin film transistor active region and the connecting region, the channel mask restricting doping of the thin film channel region with the first conductivity type impurity;

applying a metal layer over the exposed parasitic diode junction; and heating the metal layer to form a silicide shunt across the exposed parasitic diode junction, the channel mask preventing formation of silicide over the thin film channel region.

FIGS. 2–8 illustrate a thin film transistor at various processing steps. In accordance with the methods and structure of the invention, a thin film transistor active region of a first conductivity type is connected to a connecting or semiconductor region of a second conductivity type and a diode shunt is formed between the thin film active region and the connecting or semiconductor region.

Figure 1:
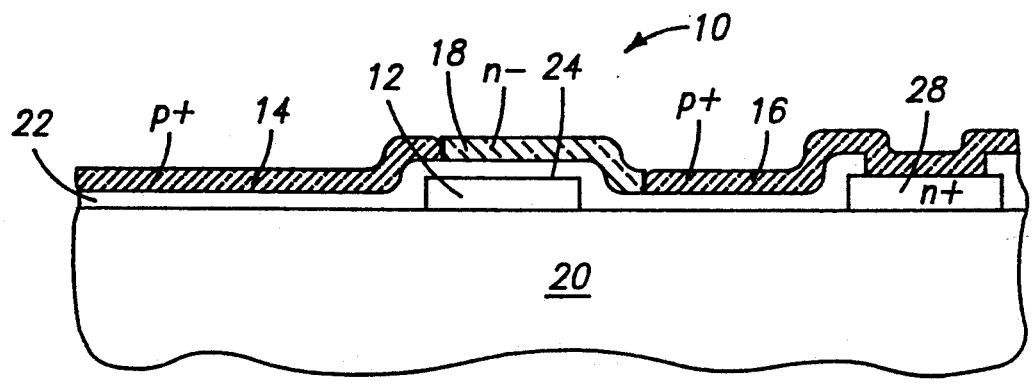
FIG. 1 is a diagrammatic section view of a portion of thin film transistor and a connected semiconductor region in accordance with the prior art, and is described in the "Background" section above.
Figure 2:
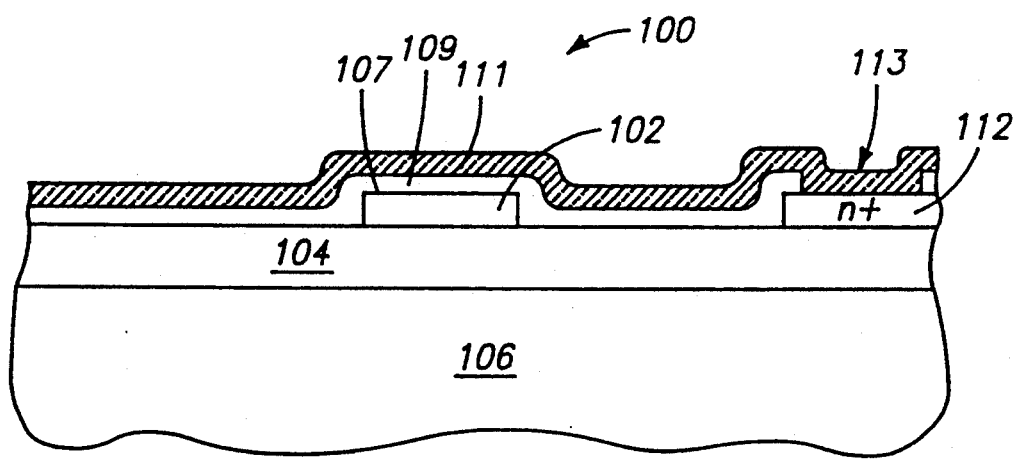
FIG. 2 is a diagrammatic section of a preferred thin film transistor and connected semiconductor region in accordance with the invention, shown at an initial processing step.
Figure 3:
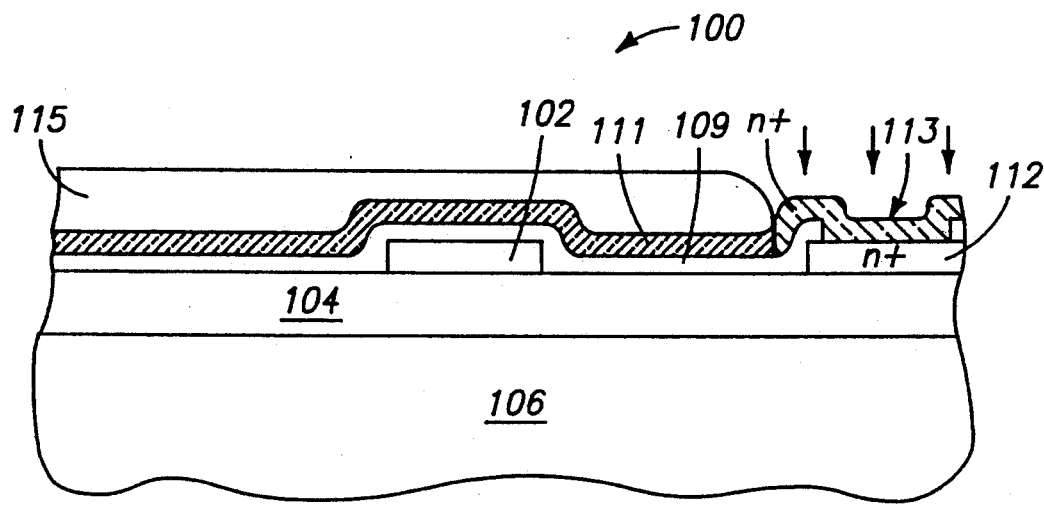
FIG. 3 is a diagrammatic section of a preferred thin film transistor and connected semiconductor region in accordance with the invention, shown at a processing step subsequent to that illustrated by FIG. 2.
Figure 4:
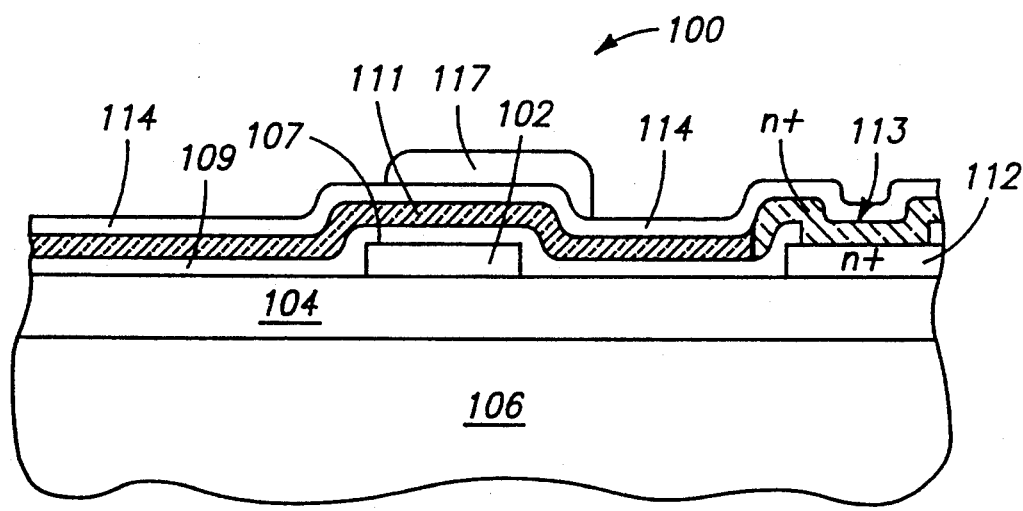
FIG. 4 is a diagrammatic section of a preferred thin film transistor and connected semiconductor region in accordance with the invention, shown at a processing step subsequent to that illustrated by FIG. 3.

Specifically referring to FIG. 2, a p-channel thin film transistor 100 is provided by forming a conductively doped polysilicon transistor gate 102 on an isolated layer of oxide 104. A silicon or other semiconductor substrate 106 forms the base on which thin film 100 and gate 102 are fabricated. Isolation oxide layer 104 isolates thin film transistor 100 from underlying devices (not shown) which may be formed on semiconductor substrate 106.

Transistor gate 102 has a top surface 107. A gate oxide layer 109 is provided over transistor gate top surface 107 and isolation oxide layer 104. Gate oxide layer 109 has a thickness over transistor gate top surface 107 which is preferably no greater than about 700 Angstroms.

Thin film transistor 100 further includes a thin film of polysilicon 111 which is provided over transistor gate 102 to a selected thickness for subsequent formation of thin film active regions of a first or p+ conductivity type. A thin film channel region in thin film 111 between the thin film active regions is also defined in subsequent processing steps. In addition, thin polysilicon film 111 extends beyond one of the thin film active regions to form a connecting region of a second or n+ conductivity type. The selected thickness of thin polysilicon film 111 is preferably less than about 1500 Angstroms.

A semiconductor region 112 of a second conductivity type is formed on semiconductor substrate 106 atop isolation oxide layer 104. Semiconductor region 112 is a conductive runner which conducts the signal produced by thin film transistor 100 to other areas (not shown) of semiconductor substrate 106. Semiconductor region 112 could conceivably be any conductive region to which an oppositely doped thin film active region might be connected, such as the drain of an n-channel MOS field effect transistor. Semiconductor region 112 is of an opposite conductivity type to the first conductivity type of the thin film active regions and therefore comprises n− or n+ semiconductor material.

In an initial thin film blanket implanting, thin polysilicon film 111 is lightly doped with an n-type impurity such as phosphorous to a level or dose which is desired for the thin film channel region. This implanting sets the eventual gate threshold level of thin film transistor 100. A preferred dose for the blanket implanting is 5 times $10^{12}$ ions/cm$^2$ at 25 KeV. The initial thin film blanket implanting could alternatively comprise a light doping with a p-type impurity.

A portion of thin polysilicon film 111 overlies semiconductor region 112 to form and define a connecting region 113. Connecting region 113 is doped to the same n+ conductivity type as semiconductor region 112 by applying and patterning a photoresist layer 115 (FIG. 3) and by then performing an implanting of a second conductivity type material such as phosphorous or arsenic to render connecting region 113 conductive. The second conductivity type implanting of connecting region 113 is performed to a preferred first dose of about $10^{15}$ ions/cm$^2$ at 25 KeV. Photoresist layer 115 is removed after implanting connecting region 113.

Connecting region 113 forms an interconnecting conductive path from thin film transistor 100 to other circuit elements, in this case to semiconductor region 112. Doping connecting region 113 to substantially the same conductivity type as semiconductor region 112 prevents formation of a buried parasitic diode at the junction of semiconductor region 112 and connecting region 113.

A mask layer 114 is subsequently applied, patterned, and etched (FIGS. 4 and 5) over thin polysilicon film 111. Mask layer 114 comprises a layer of insulating material, preferably a layer of oxide which is provided to a thickness from about 50 Angstroms to about 3000 Angstroms. More preferably, mask layer 114 has a thickness from about 400 Angstroms to about 500 Angstroms. Mask layer 114 is of a material on which a silicide will not form during a high-temperature anneal, as will be described below.

Figure 5:
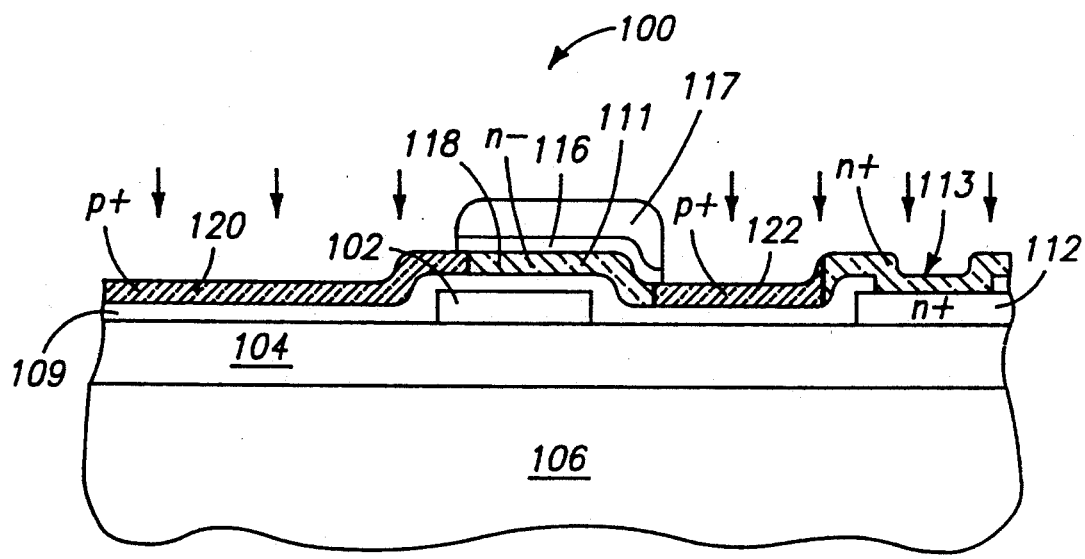
FIG. 5 is a diagrammatic section of a preferred thin film transistor and connected semiconductor region in accordance with the invention, shown at a processing step subsequent to that illustrated by FIG. 4.

After initially applying mask layer 114 (FIG. 4) over thin polysilicon film 111, a photoresist mask 117 is applied and patterned atop mask layer 114 opposite gate top surface 107. Mask layer 114 is then etched as shown in FIG. 5 to define what will be thin film active regions 120 and 122 and to remove mask layer 114 over thin film active regions 120 and 122. Such an etching forms or defines an insulating channel mask 116 which overlies and defines a channel region 118 in thin polysilicon film 111 between thin film active regions 120 and 122. Channel region 118 optionally overlies and extends in at least one direction past transistor gate 102 to form a channel offset. Such an offset has been found to reduce current leakage in thin film transistors.

A first conductivity type doping of thin film active regions 120 and 122 is performed by implanting with a p-type impurity such as boron difluoride. Channel mask 116 blocks or restricts implanting of thin film channel region 118. This p-type implanting is performed to a preferred second dose of about $10^{14}$ ions/cm$^2$ at 25 KeV, lower than the $10^{15}$ ions/cm$^2$ at 25 KeV n-type doping of connecting region 113. Accordingly, connecting region 113 remains at an n-type doping. The first conductivity type doping provides and creates p+ active regions 120 and 122 in thin polysilicon film 111 on either side of thin film channel region 118. The p+ active region 122 is adjacent n+ connecting region 113, thus forming an exposed parasitic diode junction between thin film transistor active region 122 and connecting region 113.

Photoresist mask 117 can optionally be removed before the first conductivity type doping if channel mask 116 has been provided to a sufficient thickness to block the implanting. Otherwise, photoresist mask 117 is removed after the first conductivity type implanting.

Figure 6:
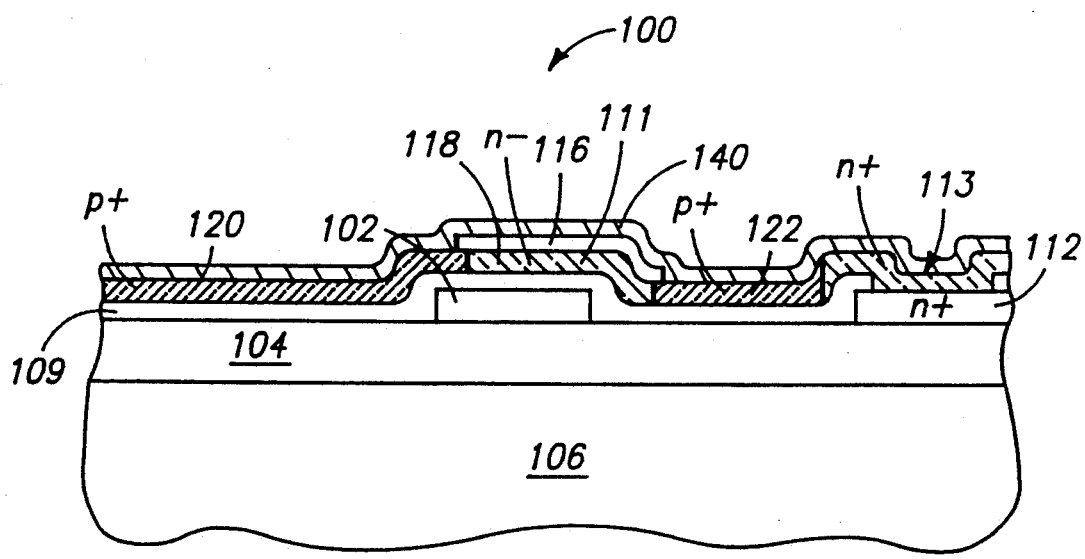
FIG. 6 is a diagrammatic section of a preferred thin film transistor and connected semiconductor region in accordance with the invention, shown at a processing step subsequent to that illustrated by FIG. 5.

Referring now to FIG. 6, a metal layer 140 is applied over thin polysilicon film 111 and the exposed parasitic diode junction as well as over channel mask 116. Metal layer 140 is preferably tungsten or titanium having a thickness from about 200 Angstroms to about 300 Angstroms.

Figure 7:
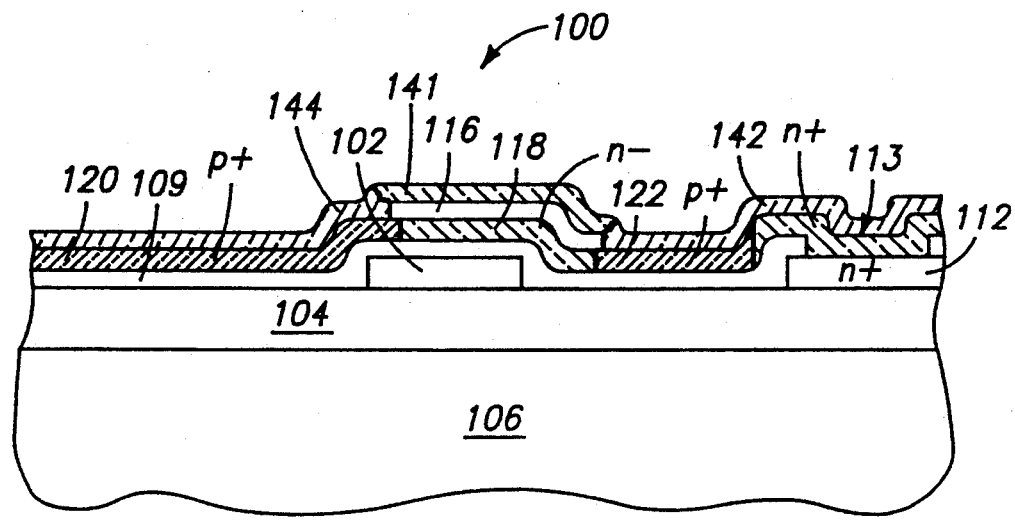
FIG. 7 is a diagrammatic section of a preferred thin film transistor and connected semiconductor region in accordance with the invention, shown at a processing step subsequent to that illustrated by FIG. 6.
Figure 8:
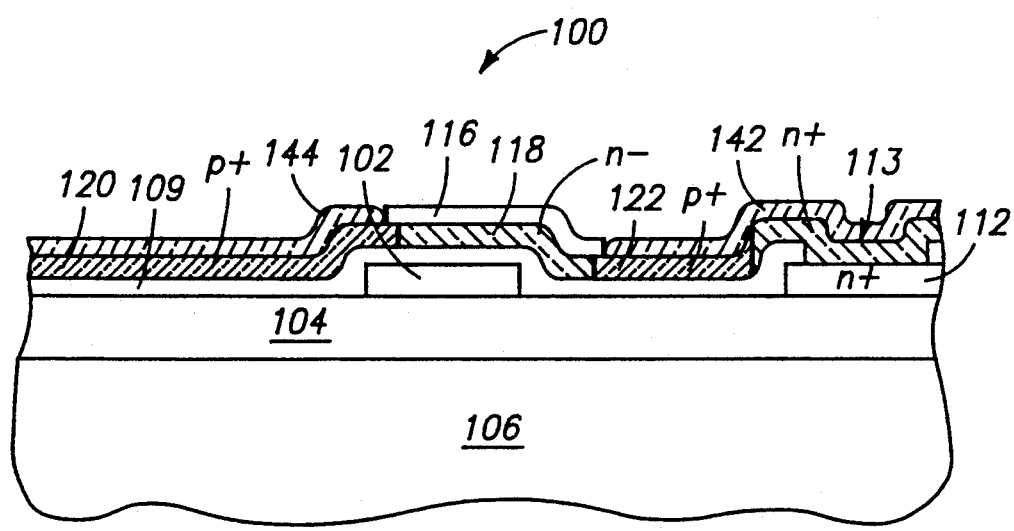
FIG. 8 is a diagrammatic section of a preferred thin film transistor and connected semiconductor region in accordance with the invention, shown at a processing step subsequent to that illustrated by FIG. 7.

Referring to FIG. 7, metal layer 140 is then heated or annealed in a nitrogen atmosphere, causing metal layer 140 to form metal silicide wherever it overlies polysilicon, such as over active regions 120 and 122 and over connecting region 113. Metal layer 140 forms a metal nitride layer 141 in remaining areas, such as over channel mask 116 and thin film channel region 118. Metal nitride is also possibly formed (not shown) in surface areas of metal layer 140 over active regions 120 and 122 and connecting region 113. The thickness of such metal nitride depends on the various annealing conditions, and could be as great or greater than the thickness of the underlying silicide. The metal nitride and any remaining metal of metal layer 140 are removed in a wet etching without disturbing the underlying oxide or metal silicide (FIG. 8). An example wet etch composition for removing titanium and titanium nitride includes sulfuric acid and hydrogen peroxide.

The metal silicide thus formed is more conductive than the underlying polysilicon regions, thus forming a silicide diode shunt 142 between thin film active region 122 and thin film connecting region 113, and across the parasitic diode junction between the two regions. A silicide layer 144 is also formed over thin film active region 120.

Besides shunting the parasitic diode, the silicide also decreases resistance throughout the p+ active regions 120 and 122 of thin film transistor 100. A further advantage of the invention is that the application of silicide is self-aligning. Mask layer 116 both defines channel region 118 and defines the regions which are to be silicided. The first conductivity type implanting of active regions 120 and 122 diffuses slightly beneath channel mask 116. Channel mask 116 therefore extends at least partially over the first conductivity type active regions 120 and 122 to isolate channel region 118 from the silicide layer. These advantages are accomplished while requiring only a single additional masking step.

The invention described above is particularly useful when a CMOS inverter is formed by a thin film transistor over an underlying complementary MOSFET. In such a circuit the complementary MOSFET drain region comprises the semiconductor region, the thin film connecting region being applied to overly and contact the MOSFET drain region. For an example of such a circuit to which this invention might be applied, see Applicant's concurrently filed application entitled "Thin Film Transistor with Self-Aligned Source and Disposable Spacers" which is hereby incorporated by reference. Also refer to Ando et. al, "A 0.1 µA Standby Current, Bouncing-Noise-Immune 1Mb SRAM", IEEE Journal of Solid State Circuits, pp. 1708–1713, December, 1989, also incorporated by reference.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a thin film transistor and of connecting a thin film transistor active region of a first conductivity type to a connecting region of a second conductivity type, the method comprising the following steps:

forming a transistor gate on a semiconductor substrate;

providing a thin film of polysilicon over the transistor gate for formation of thin film active regions and a thin film channel region;

providing a mask layer over the thin film of polysilicon;

patterning and etching the mask layer to remove the mask layer over the thin film active regions and to define a channel mask overlying the thin film channel region;

doping the thin film active regions with an impurity of the first conductivity type to provide first conductivity type active regions and to form an exposed parasitic diode junction between one thin film transistor active region and a connecting region of the second conductivity type, the channel mask restricting doping of the thin film channel region with the first conductivity type impurity;

applying a metal layer over the exposed parasitic diode junction, wherein the metal layer is capable of producing a silicide; and heating the metal layer to form a silicide shunt across the exposed parasitic diode junction, the channel mask preventing formation of silicide over the thin film channel region.

2. The method of claim 1 wherein the thin film of polysilicon extends beyond one thin film active region to form the connecting region of the second conductivity type, the method further comprising doping the connecting region with an impurity of the second conductivity type to render such region conductive.

3. The method of claim 2 wherein the second conductivity type doping of the connecting region comprises implanting to a first dose and the first conductivity type doping of the thin film active regions comprises implanting to a second dose, the second dose being lower than the first dose.

4. The method of claim 1 further comprising providing a channel offset wherein the thin film channel region overlies and extends past the transistor gate.

5. The method of claim 1 wherein the mask layer comprises a layer of insulating material.

6. The method of claim 5 wherein the mask layer comprises a layer of oxide.

7. The method of claim 5 wherein the mask layer comprises a layer of oxide which is provided to have a thickness from about 50 Angstroms to about 3000 Angstroms.

8. The method of claim 5 wherein the mask layer comprises a layer of oxide which is provided to have a thickness from about 400 Angstroms to about 500 Angstroms.

9. The method of claim 1 wherein the thin film of polysilicon is provided to have a thickness of less than about 1500 Angstroms.

10. The method of claim 1 wherein the metal layer is provided to have a thickness of less than about 300 Angstroms.

11. The method of claim 1 wherein the first conductivity type doping diffuses beneath the channel mask, the channel mask therefore extending at least partially over the first conductivity type active regions.

12. A method of forming a thin film transistor and of forming a diode shunt between a thin film transistor active region of a first conductivity type and a semiconductor region of a second conductivity type, the method comprising the following steps:

forming a semiconductor region of the second conductivity type on a semiconductor substrate;

forming a transistor gate on the semiconductor substrate;

providing a thin film polysilicon over the transistor gate for formation of thin film active regions and a thin film channel region, a portion of the thin film of polysilicon overlying the semiconductor region and thereby forming a connecting region in the thin film of polysilicon;

doping the thin film connecting region with an impurity of the second conductivity type;

providing a mask layer over the thin film of polysilicon;

patterning and etching the mask layer to remove the mask layer over the thin film active regions and to define a channel mask overlying the thin film channel region;

doping the thin film active regions with an impurity of the first conductivity type to provide first conductivity type active regions and to form an exposed parasitic diode junction between one thin film transistor active region and the thin film connecting region, the channel mask restricting doping of the thin film channel region with the first conductivity type impurity;

applying a metal layer over the thin film of polysilicon and the channel mask, wherein the metal layer is capable of producing a silicide; and heating the metal layer to form a silicide shunt across the parasitic diode between one thin film active region and the connecting region of the thin film of polysilicon, the channel mask preventing formation of silicide over the thin film channel region.

13. The method of claim 12 wherein the second conductivity type doping of the semiconductor region comprises implanting to a first dose and the first conductivity type doping of the thin film active regions comprises implanting to a second dose, the second dose being lower than the first dose.

14. The method of claim 12 further comprising providing a channel offset wherein the thin film channel region overlies and extends past the transistor gate.

15. The method of claim 12 wherein the mask layer comprises a layer of insulating material.

16. The method of claim 15 wherein the mask layer comprises a layer of oxide.

17. The method of claim 15 wherein the mask layer comprises a layer of oxide which is provided to have a thickness from about 50 Angstroms to about 3000 Angstroms.

18. The method of claim 15 wherein the mask layer comprises a layer of oxide which is provided to have a thickness from about 400 Angstroms to about 500 Angstroms.

19. The method of claim 12 wherein the thin film of polysilicon is provided to have a thickness of less than about 1500 Angstroms.

20. The method of claim 12 wherein the metal layer is provided to have a thickness from about 200 Angstroms to about 300 Angstroms thick.

21. The method of claim 12 wherein the first conductivity type doping diffuses beneath the channel mask, the channel mask extending at least partially over the first conductivity type active regions.

* * * * *